(12) United States Patent
Kwak

(10) Patent No.: US 7,102,160 B1
(45) Date of Patent: Sep. 5, 2006

(54) TFT LCD INCLUDING A SOURCE LINE HAVING AN EXTENSION PATTERN IN THE CHANNEL LAYER

(75) Inventor: Dong Yeung Kwak, Taegu-shi (KR)

(73) Assignee: LG.Philips LCD CO, Ltd., Seoul (KR)

( * ) Notice: Subject to any disclaimer, the term of this patent is extended or adjusted under 35 U.S.C. 154(b) by 438 days.

(21) Appl. No.: 09/660,186

(22) Filed: Sep. 12, 2000

(30) Foreign Application Priority Data

Sep. 14, 1999 (KR) .............................. 1999-39290

(51) Int. Cl.
*H01L 29/04* (2006.01)
*H01L 29/10* (2006.01)
*H01L 29/76* (2006.01)
*H01L 29/15* (2006.01)

(52) U.S. Cl. .......................... 257/57; 257/59; 257/66; 257/72

(58) Field of Classification Search .................. 257/57, 257/59, 66, 72, 347
See application file for complete search history.

(56) References Cited

U.S. PATENT DOCUMENTS 6,016,174 A * 1/2000 Endo et al. .................... 257/59

6,377,323 B1 * 4/2002 Ono et al. ..................... 257/59

FOREIGN PATENT DOCUMENTS

| JP | 62 171161 | 7/1987 | | |
|---|---|---|---|---|
| JP | 630 48526 | 3/1988 | | |
| JP | 7-66419 | * | 3/1995 | .................. 257/59 |
| JP | 70 72510 | 3/1995 | | |

* cited by examiner

*Primary Examiner*—Steven Loke
(74) *Attorney, Agent, or Firm*—McKena Long & Aldridge LLP

(57) ABSTRACT

TFT LCD including a first substrate and a second substrate, a scanning line on the first substrate, a signal line formed to cross the scanning line, a channel layer formed along the signal line and extended to a portion of the scanning line, source and drain electrodes formed separated on the channel layer over the scanning line, a pixel electrode connected to the drain electrode, and a liquid crystal layer formed between the first substrate and the second substrate.

16 Claims, 3 Drawing Sheets

US 7,102,160 B1

TFT LCD INCLUDING A SOURCE LINE HAVING AN EXTENSION PATTERN IN THE CHANNEL LAYER

BACKGROUND OF THE INVENTION

1. Field of the Invention

The present invention relates to a liquid crystal display, and more particularly, to a TFT (Thin Film Transistor) LCD (Liquid Crystal Display) having a large aperture ratio.

2. Background of the Related Art

Referring to FIG. 1A, an AMLCD (Active Matrix Liquid Crystal Display Device) used in a portable TV or a notebook computer, or the like is provided with a plurality of scanning lines 10 and signal lines 17 crossing each other, and pixel regions defined by the scanning lines 10 and the signal lines 17. These are TFTs at parts where the scanning lines 10 and the signal lines are crossed; and pixel electrodes (dashed lines in the drawing) in the pixel regions for displaying a desired picture when a voltage is applied to the scanning lines 10, to switch the TFT, and to transmit a picture signal provided to the signal lines 17 to the pixel electrodes.

Referring to FIG. 1B showing a section across line A–A', the AMLCD is provided with a gate electrode 11 on a transparent substrate 7, and a gate insulating layer 13 on the gate electrode 11. There is a channel layer 15 and an ohmic contact layer 16 of amorphous silicon a-Si on the gate insulating layer 13, and source/drain electrodes 17a and 17b on the ohmic contact layer 16. There is a protection layer 19 on an entire surface of the source/drain electrodes 17a and 17b, a contact hole 20 in the protection layer 19. The pixel electrode 21 and the drain electrode 17b are connected through the contact hole 20. In the drawing, Cgs denotes a capacitance between the gate electrode and the source electrode, Cgd denotes a capacitance between the gate electrode and the drain electrode. The Ccross denotes a capacitance in overlap regions of the scanning lines and the signal lines. The Cgs, Cgd, and Ccross are parameters influencing to an accumulated capacitance (not shown), as well as ΔVp (change in offset voltage) and ΔVpxl (change in pixel voltage). In the related art LCD, if there is a misalignment between the scanning line 10 and the signal line 17, minute variations of Cds and Cgd give influence to ΔVp and ΔVpxl, making flicker worse and causing non-uniform luminance, that deteriorates a picture quality. And, in a divided exposure for a large sized screen, the increased deviations of Cgs and Cgd caused by poor adjustment between shots worsens the foregoing problem, to impede providing a large sized LCD screen, and, since the TFT is formed on an extension line of the scanning line, to reduce an aperture ratio of the device.

SUMMARY OF THE INVENTION

Accordingly, the present invention is directed to a TFT LCD that substantially obviates one or more of the problems due to limitations and disadvantages of the related art.

An object of the present invention is to provide a TFT LCD in which an effective voltage to liquid crystal is stabilized, for making a stable operation.

Another object of the present invention is to provide TFT LCD which can maintain a fixed capacitance between a scanning line and a drain electrode even if the scanning line and the signal line are misaligned.

Another object of the present invention is to provide TFT LCD which shows no deterioration of a picture quality even in divided exposure for a large sized screen.

Further object of the present invention is to provide TFT LCD which has an improved aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the TFT LCD includes a first substrate and a second substrate, a scanning line on the first substrate, a signal line formed to cross the scanning line, a channel layer formed along the signal line and extended to a portion of the scanning line, source and drain electrodes formed separated on the channel layer over the scanning line, a pixel electrode connected to the drain electrode, and a liquid crystal layer formed between the first substrate and the second substrate.

The channel layer has a width smaller than a width of the scanning line and the signal line overlapped between the scanning line and the signal line.

The signal line, also serving as a source electrode of a TFT, requires no extension line of the related art signal line, and can maintain a capacitance Cgd between the scanning line and the drain electrode always constant even if there is misalignment between the scanning line and the signal line because a pattern extended from the drain electrode overlaps the scanning line fully.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1A:
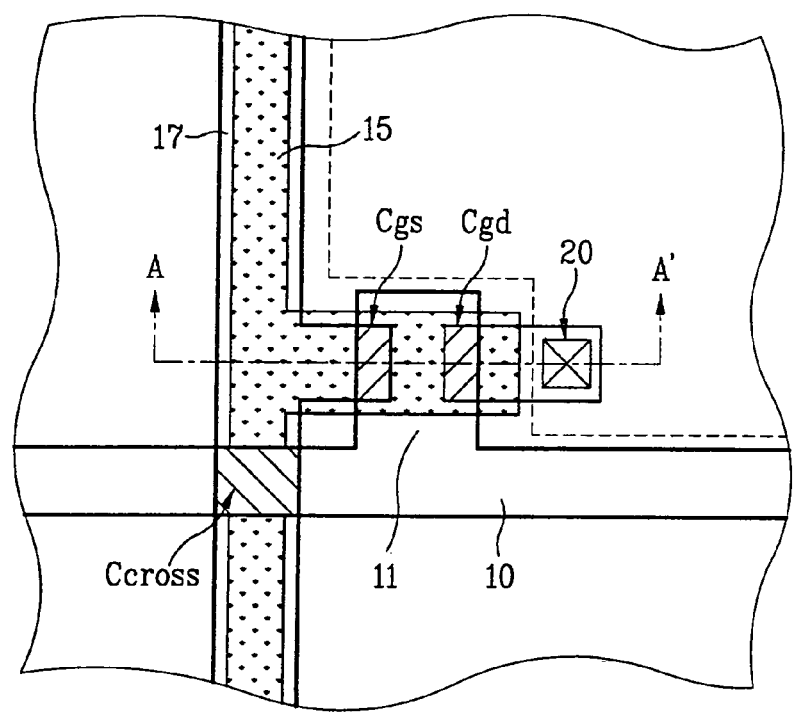
FIG. 1A illustrates a plan view of a unit pixel of a related art LCD.
Figure 1B:
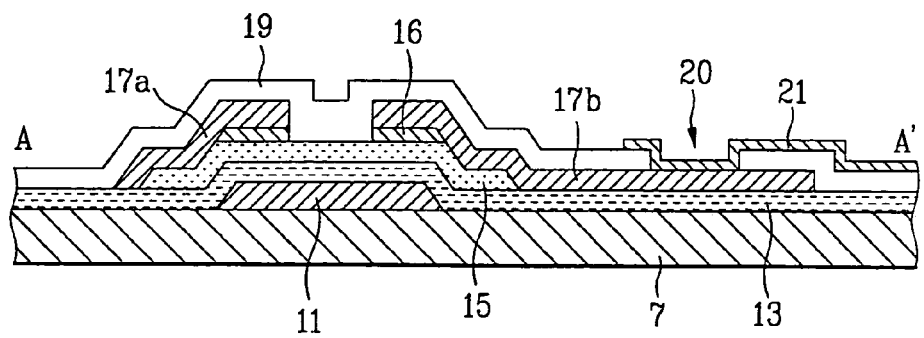
FIG. 1B illustrates a section across line A–A' in FIG. 1A.
Figure 2A:
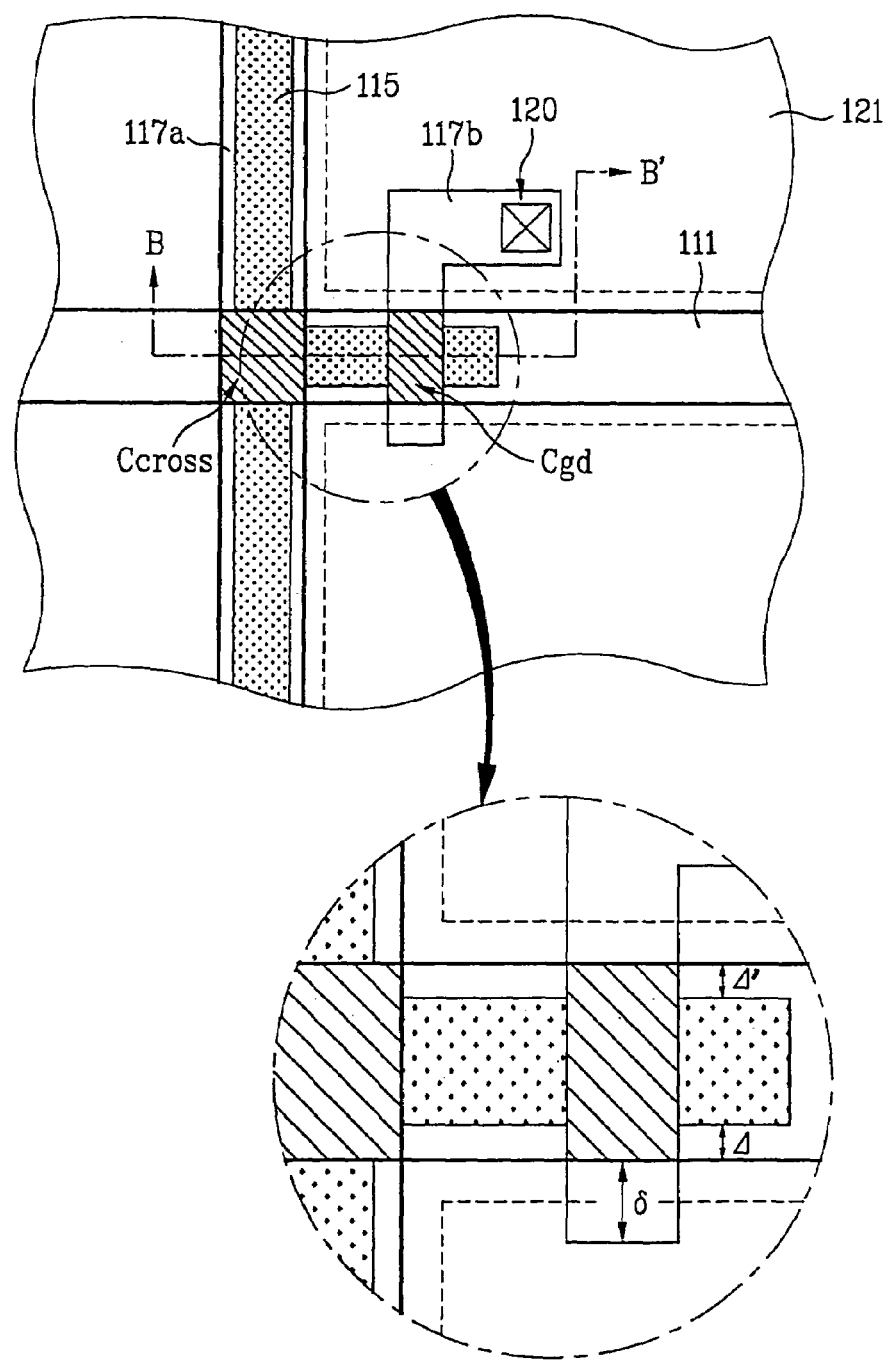
FIG. 2A illustrates a plan view of a unit pixel of an LCD in accordance with a preferred embodiment of the present invention.

Reference will now be made in detail to the preferred embodiments of the present invention, examples of which are illustrated in the accompanying drawings. FIG. 2A illustrates a plan view of a unit pixel of an LCD in accordance with a preferred embodiment of the present invention, and FIG. 2B illustrates a section across line B–B' in FIG. 2A.

Figure 2B:
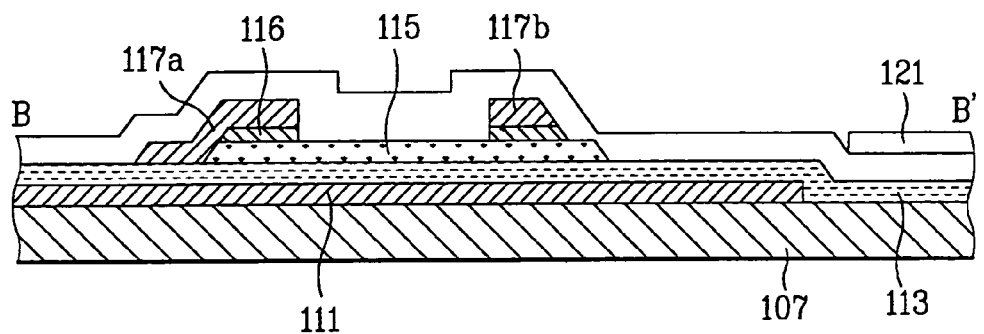
FIG. 2B illustrates a section across line B–B' in FIG. 2A.

Referring to FIG. 2B, the LCD in accordance with a preferred embodiment of the present invention includes a scanning line (a gate electrode) 111 of a metal, such as aluminum, formed on a transparent substrate 107 by sputtering. There is an insulating layer 113 of SiNx or SiOx or the like formed thereon by APCVD (Atmospheric Chemical Vapor Deposition), and a semiconductor layer 115 and an n+ layer 115 stacked in succession thereon. The semiconductor layer 115 is formed of amorphous silicon a-Si, and the insulating layer 113 is formed of $SiO_2$ having good bulk characteristics, and can prevent short circuit of the gate electrode 111 and formation of hillock at the gate electrode 11 without an anodized film. There are a channel layer and an ohmic contact layer formed by etching the semiconductor layer 115 and the n+ layer 116, and source/drain electrodes 117a and 117b of aluminum or chromium formed by sputtering and patterning. The ohmic contact layer 116 is formed by dry etching by using the source/drain electrode 117a and 117b as a mask. There is a protection layer 119 of SiNx on an entire surface of the substrate 107 formed by PECVD (Plasma Enhanced Chemical Vapor Deposition), and a pixel electrode 121 thereon in a pixel region formed by sputtering and patterning ITO (Indium Tin Oxide). The pixel electrode 121 is connected to the drain electrode 117b electrically through a contact hole 120 in the protection layer 119. The channel layer 115 has a width smaller than the widths of the scanning line 111 and the signal line 117a, and is positioned between the scanning line 111 and the signal line 117a. In this instance, since the channel layer 115 is covered with the signal line 117a, generation of off-current is prevented, to prevent deterioration of a picture quality caused by a residual image. The signal line 117a, serving as a source electrode of the TFT also, requires no extension pattern of the signal line as in the related art, and maintains a constant capacitance Ccross formed in an overlap region of the scanning line 111 and the signal line 117a. And, the signal line 117a maintains a constant capacitance Cgs between the scanning line 111 and the signal line 117a even if a misalignment occurs between the scanning line 111 and the signal line 117a. Since a pattern extended from the drain electrode 117b overlaps the scanning line 111 completely, even if there is a misalignment between the scanning line 111 and the signal line 117a, the capacitance between the scanning line 111 and the drain line 117b is always maintained constant. Accordingly, the $\Delta Vp$ and $\Delta Vpxl$ involved in the effective voltage for driving the LCD are maintained constant owing to the Cgs, Cgd and Ccross, which are always constant regardless of the misalignment. In the drawing, '$\delta$' is greater than a movement caused by the misalignment of the scanning line 111 and the signal line 117a, '$\Delta$' is greater than a movement caused by the misalignment of the scanning line 111 and the channel layer 115, and "$\Delta$" is greater than a movement caused by the misalignment of the signal line 117a and the channel layer 115.

Figure 3:
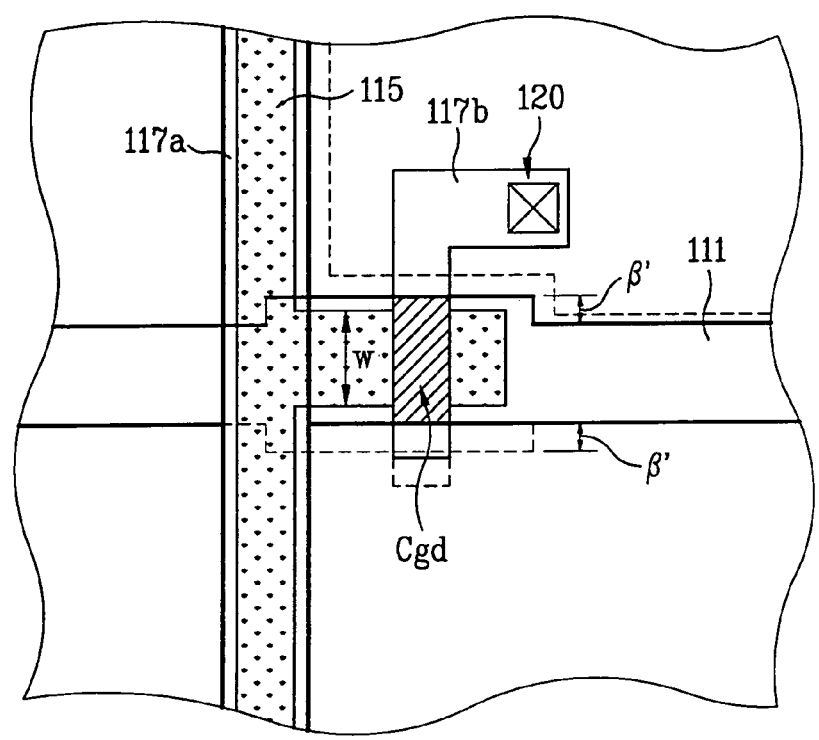
FIG. 3 illustrates a plan view of a unit pixel of an LCD in accordance with another preferred embodiment of the present invention.

FIG. 3 illustrates a plan view of a unit pixel of an LCD in accordance with another preferred embodiment of the present invention, wherein reference symbols are the same as the foregoing embodiment, and operation of the present embodiment is also the same. This embodiment is different from the previous embodiment in that a portion for the channel layer is extended by '$\beta$' to increase a width 'w' of the channel layer on the scanning line, which is wider than a variation of the Cgd caused by the misalignment, to assure a more stable operation of the LCD. As shown in FIG. 3, it is possible that the width can be increased by '$\beta$"' instead of '$\beta$' (dashed portion), or by both the '$\beta$"' and '$\beta$'.

As explained, the TFT LCD of the present invention has the following advantages.

The TFT LCD of the present invention can provide an LCD which can make a stable operation by maintaining both a capacitance Ccross formed in an overlap region of the scanning line and the signal line and the capacitance Cgs between the scanning line and the source electrode always constant, and by maintaining a capacitance Cgd between the scanning line and the drain electrode always constant by overlapping a pattern extended from the drain electrode with the scanning line completely.

And, the TFT LCD of the present invention is favorable for fabrication of a large sized LCD as a picture quality can be made uniform even in a case of a divided exposure, can improve an aperture ratio of the device because the TFT is formed on the scanning line.

It will be apparent to those skilled in the art that various modifications and variations can be made in the TFT LCD of the present invention without departing from the spirit or scope of the invention. Thus, it is intended that the present invention cover the modifications and variations of this invention provided they come within the scope of the appended claims and their equivalents.

The invention claimed is:

1. A TFT LCD (thin film transistor liquid crystal display) comprising:
    a first substrate and a second substrate;
    a scanning line on the first substrate;
    a signal line formed to cross the scanning line, wherein the signal line does not include an extension pattern in a direction perpendicular to the signal line;
    a channel layer formed along the signal line and extended to a portion of the scanning line;
    source and drain electrodes formed separated on the channel layer over the scanning line;
    a pixel electrode connected to the drain electrode; and
    a liquid crystal layer formed between the first substrate and the second substrate;
    wherein the drain electrode is parallel to the signal line and is formed to cross the scanning line.

2. A TFT LCD as claimed in claim 1, wherein the channel layer has a width smaller than a width of the signal line and a width of the scanning line.

3. A TFT LCD as claimed in claim 1, further comprising a gate insulating layer between the scanning line and the channel layer.

4. A TFT LCD as claimed in claim 1, further comprising an ohmic contact layer between each of the source electrode and the drain electrode and the channel layer.

5. A TFT LCD as claimed in claim 1, wherein the source electrode and the signal line are formed as a unit.

6. A TFT LCD comprising:
    a first substrate and a second substrate;
    a plurality of scanning lines on the first substrate;
    a gate insulating layer on an entire surface of the first substrate inclusive of the scanning lines;
    a channel layer on the gate insulating layer to cross the scanning lines having a portion extended to a top of at least one of the plurality of scanning lines;
    source and drain electrodes formed separated on the channel layer over the scanning lines;
    a signal line formed as a unit with the source electrode along the channel layer which is formed to cross the scanning lines, wherein the signal line does not include an extension pattern in a direction perpendicular to the signal line;
    a protection film formed on an entire surface of the first substrate inclusive of the signal line;
    a pixel electrode connected to the drain electrode on the protection film; and a liquid crystal layer formed between the first substrate and the second substrate, wherein the drain electrode is parallel to the signal line and is formed to cross at least one of the plurality of scanning lines.

7. A TFT LCD as claimed in claim 6, wherein the channel layer has a width smaller than a width of the signal line and a width of the at least one of the plurality of scanning lines.

8. A TFT LCD as claimed in claim 6, further comprising an ohmic contact layer between each of the source electrode and the drain electrode and the channel layer.

9. A TFT LCD as claimed in claim 6, wherein at least one of the plurality of the scanning lines has a portion enlarged in the vicinity of the signal line.

10. A TFT LCD as claimed in claim 9, wherein the channel layer is formed along the signal line over the at least one of the plurality of scanning lines, and has a width enlarged as much as a width of the at least one of the plurality of scanning lines is enlarged.

11. A TFT LCD having a first substrate, a second substrate, and liquid crystal sealed between the first and second substrates, comprising:

a scanning line on the first substrate;
a gate insulating layer on the scanning line;
a channel layer on the gate insulating layer;
a signal line formed to cross the scanning line to cover a portion of the channel layer, wherein the signal line does not include an extension pattern in a direction perpendicular to the signal line;

a drain electrode formed on the channel layer spaced a distance away from the signal line in parallel to the signal line;

a protection film formed on an entire surface of the first substrate inclusive of the drain electrode; and a pixel electrode formed on the protection film connected to the drain electrode;

wherein the drain electrode is parallel to the signal line and is formed to cross the scanning line.

12. A TFT LCD as claimed in claim 11, wherein the channel layer is formed along the signal line.

13. A TFT LCD as claimed in claim 12, wherein the channel layer has a width smaller than a width of the signal line and a width of the scanning line.

14. A TFT LCD as claimed in claim 11, wherein the signal line serves as a source electrode disposed opposite to the drain electrode.

15. A TFT LCD as claimed in claim 14, further comprising an ohmic contact layer between each of the source electrode and the drain electrode and the channel layer.

16. A TFT LCD as claimed in claim 11, further comprising a gate insulating layer between the scanning line and the channel layer.

* * * * *